United States Patent
Takagi

(10) Patent No.: US 9,420,691 B2
(45) Date of Patent: Aug. 16, 2016

(54) ELECTRONIC DEVICE, METHOD FOR MANUFACTURING THEREOF, AND ELECTRONIC APPARATUS

(71) Applicant: Seiko Epson Corporation, Tokyo (JP)

(72) Inventor: Shigekazu Takagi, Suwa (JP)

(73) Assignee: Seiko Epson Corporation (JP)

( * ) Notice: Subject to any disclaimer, the term of this patent is extended or adjusted under 35 U.S.C. 154(b) by 520 days.

(21) Appl. No.: 13/760,702

(22) Filed: Feb. 6, 2013

(65) Prior Publication Data

US 2013/0206465 A1    Aug. 15, 2013

(30) Foreign Application Priority Data

Feb. 9, 2012   (JP) ................................. 2012-026617

(51) Int. Cl.
| | | |
|---|---|---|
| B81B 7/00 | (2006.01) | |
| H05K 1/16 | (2006.01) | |
| B81B 3/00 | (2006.01) | |

(52) U.S. Cl.
CPC .............. *H05K 1/162* (2013.01); *B81B 3/0086* (2013.01); *B81B 7/007* (2013.01); *B81B 2207/095* (2013.01); *B81B 2207/096* (2013.01); *B81B 2207/097* (2013.01)

(58) Field of Classification Search
CPC ................... H05K 1/162; H05K 2201/09072; G01P 15/0802; G01P 15/125; G01P 2015/0814; B81B 2207/097
See application file for complete search history.

(56) References Cited

U.S. PATENT DOCUMENTS

| | | | |
|---|---|---|---|
| 5,627,317 A | 5/1997 | Offenberg et al. | |
| 5,719,073 A | 2/1998 | Shaw et al. | |
| 5,987,989 A | 11/1999 | Yamamoto et al. | |
| 6,170,332 B1 | 1/2001 | MacDonald et al. | |
| 6,171,881 B1 | 1/2001 | Fujii | |
| 6,388,300 B1 | 5/2002 | Kano et al. | |
| 6,494,096 B2 | 12/2002 | Sakai et al. | |
| 6,634,232 B1* | 10/2003 | Rettig | B81B 3/0051 73/514.15 |
| 6,900,071 B2* | 5/2005 | Okumura | B81C 1/00365 257/E21.279 |
| 8,671,757 B2* | 3/2014 | Reinmuth | B81B 3/0051 73/514.32 |
| 2003/0038327 A1* | 2/2003 | Smith | 257/415 |
| 2004/0021186 A1* | 2/2004 | Okumura | B81C 1/00365 257/415 |
| 2006/0063462 A1 | 3/2006 | Ding et al. | |
| 2006/0160264 A1 | 7/2006 | McDonald et al. | |
| 2007/0279876 A1* | 12/2007 | Weiblen et al. | 361/752 |
| 2008/0156095 A1* | 7/2008 | Tsuji et al. | 73/504.02 |
| 2009/0007669 A1 | 1/2009 | Fukaura | |
| 2009/0091018 A1* | 4/2009 | Maeda et al. | 257/693 |
| 2009/0166623 A1* | 7/2009 | Sato et al. | 257/49 |
| 2010/0072563 A1* | 3/2010 | Sato et al. | 257/415 |

(Continued)

FOREIGN PATENT DOCUMENTS

| | | |
|---|---|---|
| CN | 101065826 A | 10/2007 |
| JP | 05-304303 | 11/1993 |

(Continued)

*Primary Examiner* — Hoa C Nguyen
*Assistant Examiner* — Keith Depew
(74) *Attorney, Agent, or Firm* — Harness, Dickey & Pierce, P.L.C.

(57) ABSTRACT

An electronic device includes a first member including a reference potential terminal; a second member placed on a first surface of the first member and having conductivity; and a functional element accommodated in a cavity surrounded by the first member and the second member, wherein the second member and the reference potential terminal are electrically connected via a contact portion.

13 Claims, 16 Drawing Sheets

(56) References Cited

U.S. PATENT DOCUMENTS

| | | | |
|---|---|---|---|
| 2011/0014750 A1* | 1/2011 | Peng | 438/121 |
| 2011/0291644 A1 | 12/2011 | Kanemoto | |
| 2012/0057729 A1* | 3/2012 | Rauscher | 381/174 |
| 2012/0111615 A1 | 5/2012 | Yoda et al. | |
| 2012/0119311 A1* | 5/2012 | Akhlaghi Esfahany et al. | 257/415 |
| 2012/0142144 A1* | 6/2012 | Taheri | 438/107 |
| 2012/0319256 A1* | 12/2012 | Lo et al. | 257/666 |
| 2013/0099331 A1* | 4/2013 | Chen et al. | 257/414 |
| 2013/0140655 A1* | 6/2013 | Yeh et al. | 257/416 |
| 2013/0176686 A1* | 7/2013 | Lee et al. | 361/728 |
| 2013/0320559 A1* | 12/2013 | Huang et al. | 257/774 |

FOREIGN PATENT DOCUMENTS

| | | |
|---|---|---|
| JP | 07-333078 | 12/1995 |
| JP | 08-506857 | 7/1996 |
| JP | 2000-286430 | 10/2000 |
| JP | 2006-116694 A | 5/2006 |
| JP | 2011-247812 | 12/2011 |
| JP | 2012-098208 | 5/2012 |
| WO | WO-2011-103720 A1 | 9/2011 |

* cited by examiner

ELECTRONIC DEVICE, METHOD FOR MANUFACTURING THEREOF, AND ELECTRONIC APPARATUS

BACKGROUND

1. Technical Field

The present invention relates to an electronic device, a method for manufacturing thereof, and an electronic apparatus.

2. Related Art

In recent years, electronic devices including a functional element which detects a physical quantity using, for example, a silicon MEMS (Micro Electro Mechanical Systems) technique have been developed.

As the functional element, an electrostatic capacitive physical quantity sensor element has been known. The physical quantity sensor element has, for example, a fixed electrode fixedly arranged and a movable electrode facing the fixed electrode with a spacing and displaceably disposed. The physical quantity sensor element detects a physical quantity such as acceleration based on an electrostatic capacitance between the fixed electrode and the movable electrode (refer to JP-A-2011-247812). The physical quantity sensor element disclosed in JP-A-2011-247812 is accommodated in a cavity of a package configured to include a lid and a support which supports the physical quantity sensor element, and is used as an electronic device.

However, in the electronic device described above, when the potential of a member (for example, the lid) constituting the cavity fluctuates, characteristics of the functional element fluctuate, making it impossible in some cases to obtain stabilized characteristics.

SUMMARY

An advantage of some aspects of the invention is to provide an electronic device having stabilized characteristics. Another advantage of some aspects of the invention is to provide a method for manufacturing the electronic device having stabilized characteristics. Still another advantage of some aspects of the invention is to provide an electronic apparatus including the electronic device.

The invention can be implemented as the following forms or application examples.

APPLICATION EXAMPLE 1

This application example is directed to an electronic device including: a first member including a reference potential terminal; a second member placed on a first surface of the first member and having conductivity; and a functional element accommodated in a cavity surrounded by the first member and the second member, wherein the second member and the reference potential terminal are electrically connected via a contact portion.

According to the electronic device, since the contact portion electrically connects the second member with the reference potential terminal, the potential of the second member can be fixed. With this configuration, characteristics of the functional element can be prevented from becoming unstable due to the fluctuation of the potential of the second member, so that stabilized characteristics can be provided.

It is noted that, in the descriptions concerning the invention, the phrase "electrically connect" or "electrically connected" may be used, for example, in a manner as "a specific member (hereinafter referred to as "A member") "electrically connected" to another specific member (hereinafter referred to as "B member")". In the descriptions concerning the invention, in the case of such an example, the phrase "electrically connect" or "electrically connected" is used, while assuming that it includes the case in which A member and B member are electrically connected indirect contact with each other, and the case in which A member and B member are electrically connected via another member.

APPLICATION EXAMPLE 2

In the electronic device according to the application example described above, a recess may be disposed on the side of the first surface of the first member, and the contact portion may be arranged within the recess.

According to the electronic device of this configuration, the potential of the second member can be fixed. With this configuration, characteristics of the functional element can be prevented from becoming unstable due to the fluctuation of the potential of the second member, so that stabilized characteristics can be provided.

APPLICATION EXAMPLE 3

In the electronic device according to the application example described above, the reference potential terminal may be disposed on the side of the first surface of the first member, and a wiring which connects the contact portion with the reference potential terminal may be disposed within the recess.

According to the electronic device of this configuration, the contact portion and the reference potential terminal can be formed at any positions, so that the degree of freedom of design can be enhanced.

APPLICATION EXAMPLE 4

In the electronic device according to the application example described above, the reference potential terminal may be disposed on a surface of the first member on the side opposed to the first surface, and the contact portion and the reference potential terminal may be connected via a through-electrode penetrating through the first member.

According to the electronic device of this configuration, the potential of the second member can be fixed. With this configuration, characteristics of the functional element can be prevented from becoming unstable due to the fluctuation of the potential of the second member, so that stabilized characteristics can be provided.

APPLICATION EXAMPLE 5

In the electronic device according to the application example described above, the reference potential terminal may be electrically connected with the functional element through a second wiring, and the contact portion may be disposed on the second wiring.

According to the electronic device of this configuration, a wiring which connects the reference potential terminal with the contact portion and a wiring which connects the reference potential terminal with the functional element can be made common.

APPLICATION EXAMPLE 6

In the electronic device according to the application example described above, the contact portion may be disposed on the side of the second member.

According to the electronic device of this configuration, the potential of the second member can be fixed. With this configuration, characteristics of the functional element can be prevented from becoming unstable due to the fluctuation of the potential of the second member, so that stabilized characteristics can be provided.

APPLICATION EXAMPLE 7

In the electronic device according to the application example described above, the contact portion may be disposed integrally with the second member.

According to the electronic device of this configuration, the potential of the second member can be fixed. With this configuration, characteristics of the functional element can be prevented from becoming unstable due to the fluctuation of the potential of the second member, so that stabilized characteristics can be provided.

APPLICATION EXAMPLE 8

In the electronic device according to the application example described above, the material of the first member may be glass, the material of the second member may be silicon, and the first member and the second member may be anodically bonded together.

According to the electronic device of this configuration, the second member can be strongly bonded to the first member, so that the impact resistance of the electronic device can be improved. Further, when, for example, the first member and the second member are bonded together with an adhesive member such as glass frit, a region is required to some extent as a bonding margin because the adhesive member spreads in bonding. However, such a region can be reduced according to anodic bonding. Therefore, a reduction in the size of the electronic device can be achieved.

APPLICATION EXAMPLE 9

In the electronic device according to the application example described above, the functional element may be a physical quantity sensor.

According to the electronic device of this configuration, characteristics of the functional element can be prevented from becoming unstable due to the fluctuation of the potential of the second member, so that stabilized characteristics can be provided.

APPLICATION EXAMPLE 10

This application example is directed to a method for manufacturing an electronic device, including: forming a reference potential terminal in a first member including a first surface where a recess is disposed; forming a contact portion on a second surface of a second member having conductivity; and bonding the first surface and the second surface together to accommodate a functional element in a cavity surrounded by the first member and the second member and arrange the contact portion within the recess, wherein the second member and the reference potential terminal are electrically connected via the contact portion.

According to the method for manufacturing the electronic device, since the contact portion electrically connects the second member with the reference potential terminal, the potential of the second member can be fixed. With this configuration, characteristics of the functional element can be prevented from becoming unstable due to the fluctuation of the potential of the second member, so that an electronic device having stabilized characteristics can be obtained. Further, according to the method for manufacturing the electronic device, in the bonding of the first member and the second member together, the contact portion can be arranged within the recess to electrically connect the second member with the reference potential terminal, and therefore manufacturing steps can be simplified.

APPLICATION EXAMPLE 11

In the method for manufacturing the electronic device according to the application example described above, the material of the first member may be glass, the material of the second member may be silicon, and the bonding of the first surface and the second surface together may be performed by anodic bonding.

According to the method for manufacturing the electronic device of this configuration, the first member can be strongly bonded to the second member by anodic bonding, so that an improvement in the impact resistance of the electronic device can be achieved. Further, when, for example, the first member and the second member are bonded together with an adhesive member such as glass frit, a region is required to some extent as a bonding margin because the adhesive member spreads in bonding. However, such a region can be reduced according to anodic bonding. Therefore, a reduction in the size of the electronic device can be achieved.

APPLICATION EXAMPLE 12

In the method for manufacturing the electronic device according to the application example described above, the method may further include forming within the recess a wiring electrically connected to the reference potential terminal, and in the bonding of the first surface and the second surface together, the contact portion and the wiring may be electrically connected.

According to the method for manufacturing the electronic device of this configuration, in the bonding of the first surface and the second surface together, the contact portion can be arranged within the recess to electrically connect the second member with the reference potential terminal, and therefore manufacturing steps can be simplified.

APPLICATION EXAMPLE 13

This application example is directed to an electronic apparatus including the electronic device according to the application example described above.

According to the electronic apparatus, since the electronic device according to the application example is included, stabilized characteristics can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail using the drawings. The embodiment described below does not unduly limit the contents of the invention set forth in the appended claims. Moreover, not all of configurations described below are indispensable constituent requirements of the invention.

1. Electronic Device

Figure 1:
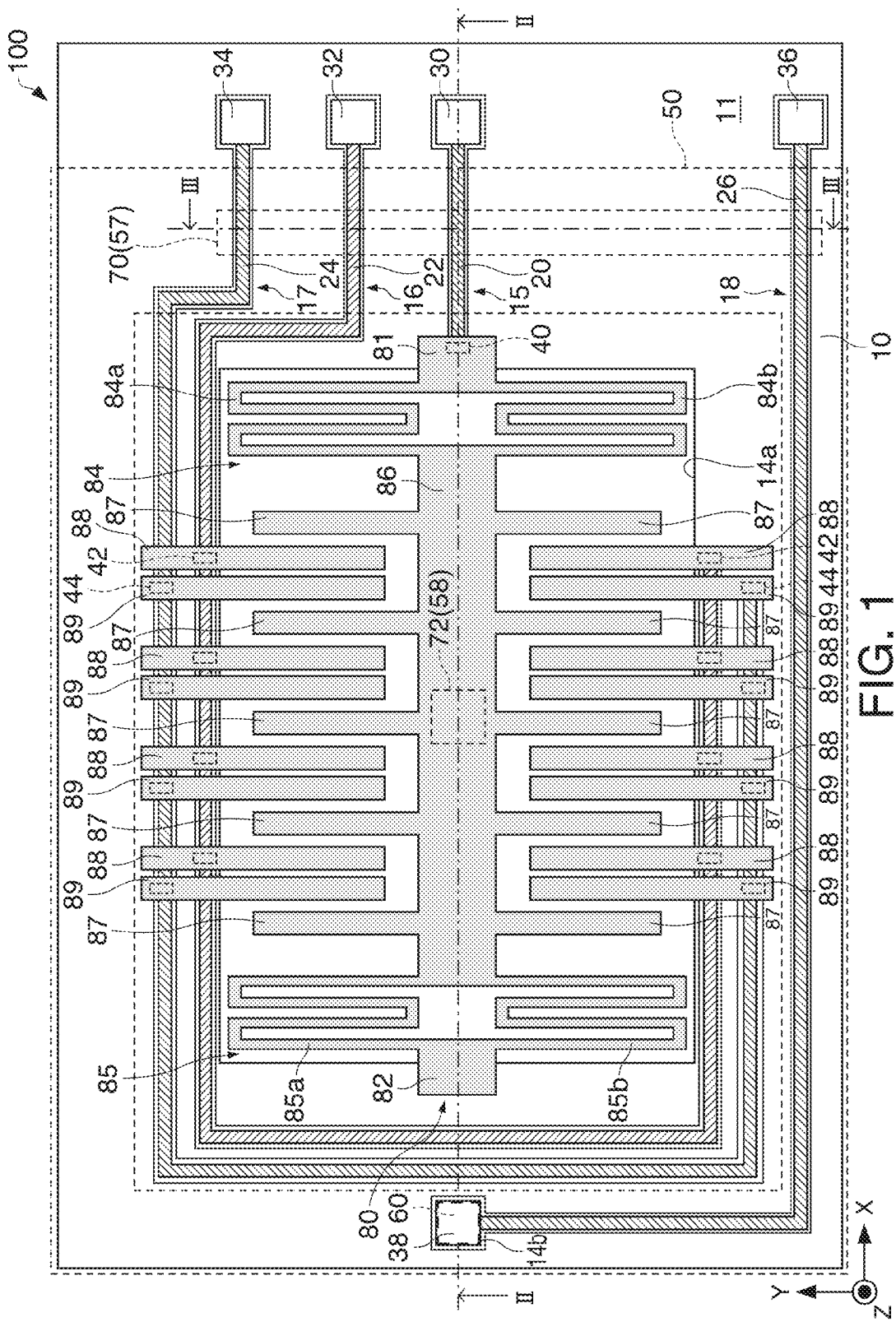
FIG. 1 is a plan view schematically showing an electronic device according to an embodiment.
Figure 2:
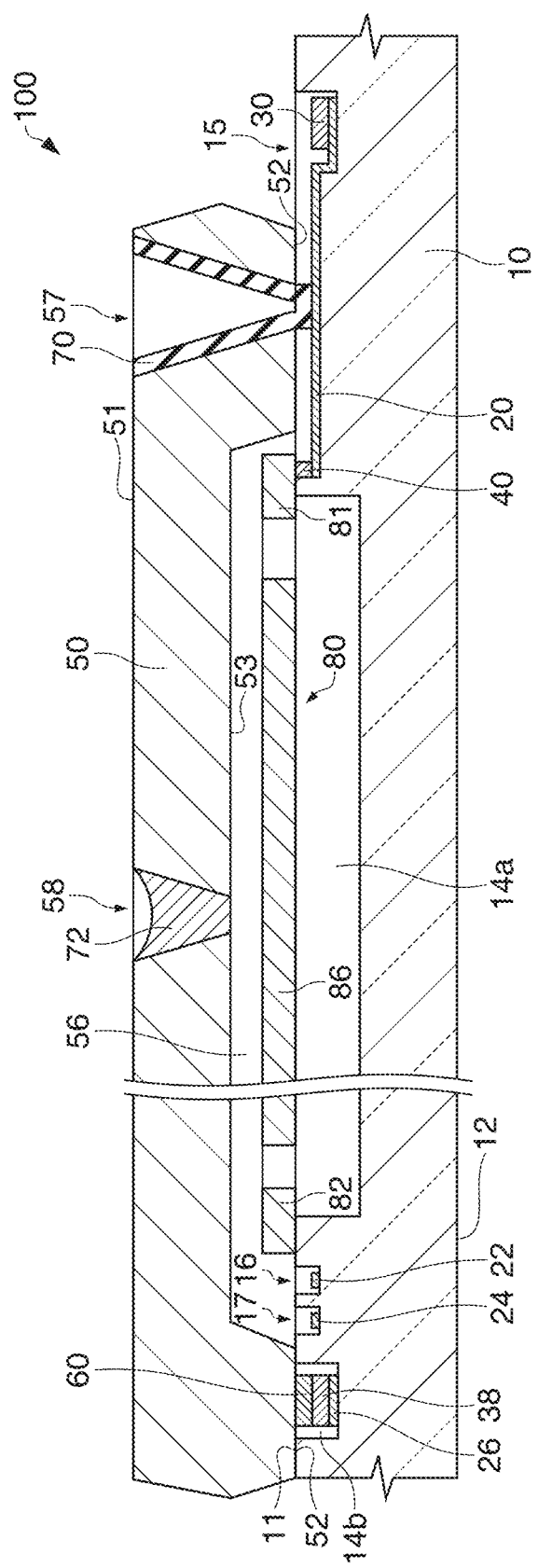
FIG. 2 is a cross-sectional view schematically showing the electronic device according to the embodiment.
Figure 3:
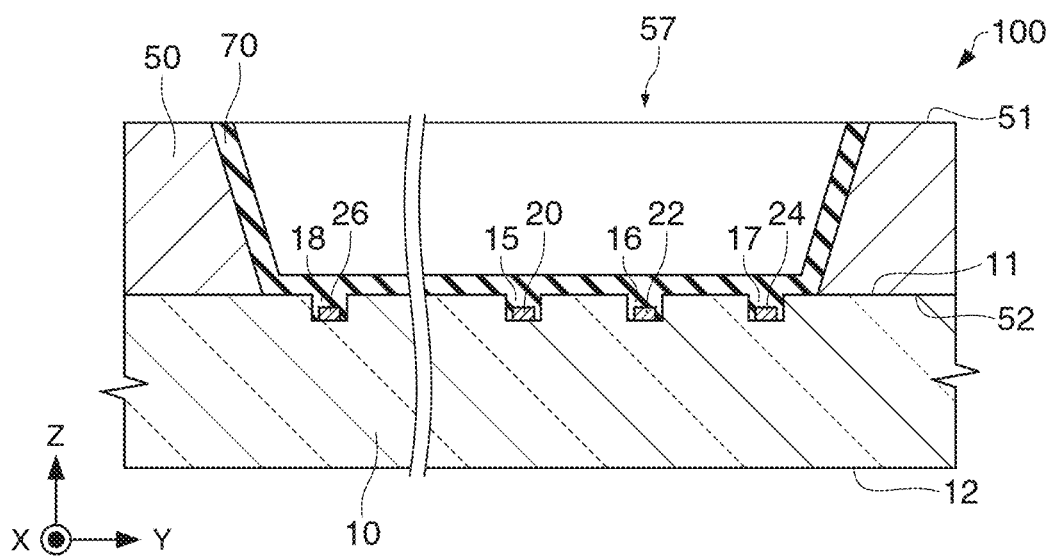
FIG. 3 is a cross-sectional view schematically showing the electronic device according to the embodiment.

First, an electronic device according to the embodiment will be described with reference to the drawings. FIG. 1 is a plan view schematically showing the electronic device 100 according to the embodiment. FIG. 2 is a cross-sectional view schematically showing the electronic device 100 according to the embodiment and taken along line II-II of FIG. 1. FIG. 3 is a cross-sectional view schematically showing the electronic device 100 according to the embodiment and taken along line III-III of FIG. 1. In FIGS. 1 to 3, an X-axis, a Y-axis, and a Z-axis are illustrated as three axes orthogonal to each other.

As shown in FIGS. 1 to 3, the electronic device 100 includes a base substance (first member) 10, a connection terminal (reference potential terminal) 36, a lid (second member) 50, a contact portion 60, and a functional element 80. Further, the electronic device 100 can include, for example, groove portions 15, 16, 17, and 18, wirings 20, 22, 24, and 26, connection terminals 30, 32, 34, 36, and 38, a filling member 70, and a sealing member 72. For convenience sake, the lid 50, the contact portion 60, the filling member 70, and the sealing member 72 are illustrated in a perspective manner in FIG. 1.

The material of the base substance 10 is, for example, glass. The material of the base substance 10 is not limited to glass and may be, for example, silicon. As shown in FIG. 2, the base substance 10 has an upper surface (first surface) 11 and a lower surface 12 on the side opposed to the upper surface 11. In the illustrated example, the upper surface 11 is directed to a +Z direction, while the lower surface 12 is directed to a −Z direction. A portion of the upper surface 11 of the base substance 10 and a lower surface (second surface) 52 of the lid 50 are bonded together. In the upper surface 11 of the base substance 10, a first recess 14a and a second recess 14b are disposed. In the upper surface 11 of the base substance 10, the groove portions 15, 16, 17, and 18 are further disposed.

Above the first recess 14a, a movable portion 86 and movable electrode portions 87 of the functional element 80 are arranged. The movable portion 86 and the movable electrode portions 87 can move to a desired direction due to the first recess 14a without being obstructed by the base substance 10. The planar shape (a shape when viewed from a Z-axis direction) of the first recess 14a is not particularly limited but is a rectangle in the example shown in FIG. 1.

The second recess 14b is disposed, in plan view (viewed from the Z-axis direction), in a region of the upper surface 11 of the base substance 10, the region overlapping the lower surface 52 of the lid 50. The second recess 14b is disposed outside of a cavity 56 (a region not overlapping the cavity 56 in plan view). The groove portion 18 is connected to the second recess 14b. The connection terminal 38 and the wiring 26 are disposed within the second recess 14b. In the example shown in FIG. 2, the wiring 26 is disposed on a surface of the base substance 10, the surface defining a bottom surface of the second recess 14b, and the connection terminal 38 is disposed on the wiring 26. Further, the contact portion 60 is located on the connection terminal 38. The connection terminal 38 and the contact portion 60 are connected within the second recess 14b. The depth (the size in the Z-axis direction) of the second recess 14b, that is, a distance between the upper surface 11 of the base substance 10 and the bottom surface of the second recess 14b is the same as the thickness (the size in the Z-axis direction) of the wiring 26, the connection terminal 38, and the contact portion 60. In the example of FIG. 2, the depth of the second recess 14b is the same as that of a region of the groove portion 15 where the connection terminal 30 is disposed. Although not illustrated, a protruding portion may be disposed on the surface defining the bottom surface of the second recess 14b, and the wiring 26 and the connection terminal 38 may be disposed on the protruding portion. The contact portion 60 and the wiring 26 may be directly connected without disposing the connection terminal 38.

The groove portion 15 is disposed in the upper surface 11 of the base substance 10. The groove portion 15 extends from the inside to the outside of the cavity 56 surrounded by the base substance 10 and the lid 50. The groove portion 15 has, for example, a planar shape corresponding to the planar shape of the wiring 20 and the connection terminal 30.

Similarly, the groove portions 16 and 17 are disposed in the upper surface 11 of the base substance 10. In the example shown in FIG. 1, the groove portions 16 and 17 are disposed so as to be along the circumference of the first recess 14a. The groove portions 16 and 17 extend from the inside to the outside of the cavity 56. The groove portion 16 has, for example, a planar shape corresponding to the planar shape of the wiring 22 and the connection terminal 32. The groove portion 17 has, for example, a planar shape corresponding to the planar shape of the wiring 24 and the connection terminal 34.

The groove portion 18 is disposed in the upper surface 11 of the base substance 10. In the example shown in FIG. 1, the groove portion 18 is disposed so as to be along the circumference of the first recess 14a. The groove portion 18 extends from the second recess 14b to the position of the connection terminal 36 (outside of the cavity 56). The groove portion 18 has, for example, a planar shape corresponding to the planar shape of the wiring 26 and the connection terminal 36.

The depth (the size in the Z-axis direction) of the groove portions 15, 16, 17, and 18 is greater than the thickness (the size in the Z-axis direction) of the wirings 20, 22, 24, and 26 and the connection terminals 30, 32, 34, and 36. With this configuration, the wirings 20, 22, 24, and 26 and the connection terminals 30, 32, 34, and 36 can be prevented from protruding higher (the +Z direction) than the upper surface 11 of the base substance 10.

The wiring 20 is disposed within the groove portion 15. More specifically, the wiring 20 is disposed on a surface of the base substance 10, the surface defining a bottom surface of the groove portion 15. The wiring 20 electrically connects the functional element 80 with the connection terminal 30. In the illustrated example, the wiring 20 is connected to a fixed portion 81 of the functional element 80 via a contact portion 40 disposed within the groove portion 15.

The wiring 22 is disposed within the groove portion 16. More specifically, the wiring 22 is disposed on a surface of the base substance 10, the surface defining a bottom surface of the groove portion 16. The wiring 22 electrically connects the functional element 80 with the connection terminal 32. In the illustrated example, the wiring 22 is connected to fixed electrode portions 88 of the functional element 80 via contact portions 42.

The wiring 24 is disposed within the groove portion 17. More specifically, the wiring 24 is disposed on a surface of the base substance 10, the surface defining a bottom surface of the groove portion 17. The wiring 24 electrically connects the functional element 80 with the connection terminal 34. In the illustrated example, the wiring 24 is connected to fixed electrode portions 89 of the functional element 80 via contact portions 44.

The wiring (first wiring) 26 is disposed within the second recess 14b and within the groove portion 18. More specifically, the wiring 26 is disposed on the surface of the base substance 10, the surface defining the bottom surface of the second recess 14b, and on a surface of the base substance 10, the surface defining a bottom surface of the groove portion 18. The wiring 26 electrically connects the contact portion with the connection terminal 36 (reference potential terminal). The wiring 26 is electrically connected to the contact portion 60 via the connection terminal 38.

The connection terminal 30 is disposed on the side of the upper surface 11 of the base substance 10. In the example shown in FIG. 2, the connection terminal 30 is disposed on the wiring 20 within the groove portion 15. The connection terminal 30 is arranged outside of the cavity 56. That is, the connection terminal 30 is disposed, in plan view, at a position not overlapping the lid 50.

Similarly, the connection terminals 32 and 34 are disposed on the side of the upper surface 11 of the base substance 10. For example, the connection terminal 32 is disposed on the wiring 22 within the groove portion 16, while the connection terminal 34 is disposed on the wiring 24 within the groove portion 17.

The connection terminal (reference potential terminal) 36 is disposed on the side of the upper surface 11 of the base substance 10. For example, the connection terminal 36 is disposed on the wiring 26 within the groove portion 18. A potential serving as a reference (a potential not fluctuating in the operation of the functional element; a fixed potential) is given to the connection terminal 36 from the outside (a potential supply unit (not shown)). The connection terminal 36 may be grounded via, for example, a wiring (not shown). The potential given to the connection terminal 36 may be the same as that given to the connection terminal 30 (the movable portion 86 and the movable electrode portions 87 of the functional element 80).

The connection terminals 32, 34, and 36 are arranged outside of the cavity 56. That is, the connection terminals 32, 34, and 36 are disposed, in plan view, at positions not overlapping the lid 50. In the example shown in FIG. 1, the connection terminals 30, 32, 34, and 36 are arranged in parallel along the Y-axis.

The connection terminal 38 is disposed on the side of the upper surface 11 of the base substance 10. In the example shown in FIG. 2, the connection terminal 38 is disposed on the wiring 26 within the second recess 14b. The connection terminal 38 is disposed, in plan view, at a position overlapping the contact portion 60. The connection terminal 38 is connected to the contact portion 60.

The material of the wirings 20, 22, 24, and 26 and the connection terminals 30, 32, 34, and 36 is, for example, ITO (Indium Tin Oxide), aluminum, gold, platinum, titanium, tungsten, chromium, nickel, or the like. The material of the connection terminal 38 and the contact portions 40, 42, and 44 is, for example, gold, copper, aluminum, platinum, titanium, tungsten, chromium, nickel, or the like. In the case in which a transparent electrode material such as ITO is used as the material of the wirings 20, 22, 24, and 26 and the connection terminals 30, 32, 34, and 36, when the base substance 10 is transparent, a foreign substance existing on, for example, the wirings 20, 22, 24, and 26 or on the connection terminals 30, 32, 34, and 36 can be visually recognized easily from the side of the lower surface 12 of the base substance 10.

In the above, a case has been described as an example in which the three wirings 20, 22, and 24 and the three connection terminals 30, 32, and 34 are included as the wirings and connection terminals connected to the functional element 80. However, the numbers of wirings and connection terminals can be appropriately changed depending on the shape or number of the functional element 80.

The lid 50 is placed on the upper surface 11 of the base substance 10. In the example shown in FIGS. 2 and 3, the lid 50 is placed on the base substance 10. The lid 50 has an upper surface 51 and the lower surface 52 on the side opposed to the upper surface 51. In the illustrated example, the upper surface 51 is directed to the +Z direction, while the lower surface 52 is directed to the −Z direction. A portion of the lower surface 52 of the lid 50 is bonded to the base substance 10 (the upper surface 11 of the base substance 10). A recess forming the cavity 56 is disposed in the lower surface 52 of the lid 50, which enables the lid 50 to have a surface 53 defining the cavity 56. Although not illustrated, the lid 50 may be bonded to the base substance 10 via an adhesive member. In this case, the contact portion 60 may not be arranged within the second recess 14b.

As shown in FIG. 2, the wiring 20 is disposed within the groove portion 15, whereby the lid 50 is arranged spaced apart from the wiring 20. More specifically, the lower surface 52 of the lid 50 includes a portion arranged to face the wiring 20 via a gap. Similarly, the wirings 22, 24, and 26 are disposed within the groove portions 16, 17, and 18, whereby the lid 50 is arranged spaced apart from the wirings 22, 24, and 26. The lower surface 52 of the lid 50 includes portions arranged to face the wirings 22, 24, and 26 via gaps.

The lid 50 has conductivity. The material of the lid 50 is, for example, silicon. A method for bonding the lid 50 and the base substance 10 together is not particularly limited. For example, when the material of the base substance 10 is glass and the material of the lid 50 is silicon, the base substance 10 and the lid 50 can be anodically bonded together.

The base substance 10 and the lid 50 can constitute a package. The base substance 10 and the lid 50 can form the cavity 56, in which the functional element 80 can be accommodated. The cavity 56 is hermetically sealed in, for example, an inert gas (for example, nitrogen gas) atmosphere or a reduced-pressure state.

A first through-hole 57 is disposed in the lid 50. As shown in FIG. 1, the first through-hole 57 is disposed, in plan view (viewed from the Z-axis direction), at a position overlapping the groove portions 15, 16, 17, and 18. In the example shown in FIG. 3, the first through-hole 57 is disposed above the groove portions 15, 16, 17, and 18 (above the wirings 20, 22, 24, and 26).

As shown in FIGS. 2 and 3, the first through-hole 57 is disposed from the upper surface 51 to the lower surface 52 of the lid 50, penetrating through the lid 50 in the Z-axis direction. It is desirable that the first through-hole 57 has, for example, a tapered shape in which the opening size of the first through-hole decreases toward the side of the base substance 10 (from the upper surface 51 toward the lower surface 52). In such a form, the filling member 70 is easily deposited to the hole bottom in the deposition of the filling member.

In the illustrated example, one first through-hole 57 overlapping the groove portions 15, 16, 17, and 18 in plan view is disposed. However, a plurality of (four) through-holes may be disposed corresponding to the plurality of (four) groove portions 15, 16, 17, and 18. In such a form, for example, the bonding area of the base substance 10 and the lid 50 can be increased, so that the bonding strength can be increased.

A second through-hole 58 is disposed from the upper surface 51 of the lid 50 to the surface 53 defining the cavity 56, penetrating through the lid 50 in the Z-axis direction. The second through-hole 58 is in communication with the cavity 56. It is preferable that the second through-hole 58 has, for example, a tapered shape in which the opening size of the second through-hole decreases toward the side of the base substance 10 (from the upper surface 51 toward the surface 53 defining the cavity 56). In such a form, the drop of a solder ball (described later) can be prevented in the melting of the solder ball. Moreover, since the structure has an opening area narrowing toward the side of the cavity 56, sealing can be performed more reliably.

The contact portion 60 is disposed on the lower surface 52 of the lid 50. The contact portion 60 is disposed in a region of the lower surface 52 of the lid 50, the region overlapping the second recess 14b in plan view. The contact portion 60 protrudes in the −Z direction beyond the lower surface 52 of the lid 50. Therefore, at least a portion of the contact portion 60 is located closer to the side of the base substance 10 than the upper surface 11 of the base substance 10 and arranged within the second recess 14b. Although not illustrated, the contact portion 60 may be disposed on the base substance 10. For example, the contact portion 60 may be disposed on the wiring 26.

The material of the contact portion 60 is, for example, gold, copper, aluminum, platinum, titanium, tungsten, chromium, nickel, or the like. As the material of the contact portion 60, gold is desirable. With this configuration, when gold is used as the material of the connection terminal 38, a contact resistance between the contact portion 60 and the connection terminal 38 can be reduced. Further, eutectic reaction is possible with heat generated when the lid 50 and the base substance 10 are anodically bonded together. The contact portion 60 is electrically connected with the lid 50. Although not illustrated, a metal layer may be disposed between the contact portion 60 and the lid 50. For example, when the material of the contact portion 60 is gold and the material of the lid 50 is silicon, a metal layer such as a chromium layer or a nickel layer for preventing the diffusion of gold to the lid 50 may be disposed between the contact portion 60 and the lid 50.

The contact portion 60 is electrically connected to the connection terminal (reference potential terminal) 36 via the connection terminal 38 and the wiring 26. With this configuration, the lid 50 and the connection terminal (reference potential terminal) 36 are electrically connected, so that the potential of the lid 50 can be fixed (the potential can be made constant). In the example shown in FIG. 1, the contact portion 60 is located on the side of a −X direction of the cavity 56, while the connection terminal (reference potential terminal) 36 is located on the side of a +X direction of the cavity 56. The contact portion 60 and the connection terminal (reference potential terminal) 36 are electrically connected via the wiring 26 disposed so as to be along the circumference of the cavity 56.

As shown in FIGS. 2 and 3, the filling member 70 is disposed within the first through-hole 57 and within the groove portions 15, 16, 17, and 18 and fills the groove portions 15, 16, 17, and 18. In the example shown in FIG. 2, the filling member 70 fills a portion of the groove portion 15. As shown in FIG. 3, the filling member 70 is disposed along, for example, the inner surface (a surface of the lid 50, the surface defining the first through-hole 57) of the first through-hole 57 and is in contact with the wirings 20, 22, 24, and 26 and the upper surface 11 of the base substance 10. Although not illustrated, the filling member 70 may be disposed so as to fully fill the first through-hole 57. The cavity 56 is hermetically sealed by the filling member 70. As the filling member 70, an insulating film such as a silicon oxide film (more specifically, a TEOS (Tetra Ethyl Ortho Silicate) film) or a silicon nitride film (SiN), for example, is used.

The sealing member 72 is disposed within the second through-hole 58 to close the second through-hole 58. The cavity 56 is hermetically sealed by the sealing member 72. The material of the sealing member 72 is, for example, an alloy such as AuGe, AuSi, AuSn, SnPb, PbAg, SnAgCu, or SnZnBi.

The functional element 80 is supported on the upper surface 11 of the base substance 10 (on the base substance 10). The functional element 80 is accommodated in the cavity 56 surrounded by the base substance 10 and the lid 50. In the following, a case will be described in which the functional element 80 is an acceleration sensor element (electrostatic capacitive MEMS acceleration sensor element) which detects acceleration in the horizontal direction (the X-axis direction).

As shown in FIGS. 1 and 2, the functional element 80 can include the fixed portion 81 and a fixed portion 82, coupling portions 84 and 85, the movable portion 86, the movable electrode portions 87, and the fixed electrode portions 88 and 89.

The movable portion 86 is displaced in the X-axis direction (the +X direction or the −X direction) while elastically deforming the coupling portions 84 and 85 according to a change in acceleration in the X-axis direction. With such displacement, the sizes of a clearance between the movable electrode portion 87 and the fixed electrode portion 88 and a clearance between the movable electrode portion 87 and the fixed electrode portion 89 change. That is, with such displacement, the magnitudes of an electrostatic capacitance between the movable electrode portion 87 and the fixed electrode portion 88 and an electrostatic capacitance between the movable electrode portion 87 and the fixed electrode portion 89 change. Based on changes in these electrostatic capacitances, the functional element 80 (the electronic device 100) can detect acceleration in the X-axis direction.

The fixed portions 81 and 82 are bonded to the upper surface 11 of the base substance 10. In the illustrated example, the fixed portions 81 and 82 are disposed, in plan view, so as to stride over the circumferential edge of the first recess 14a.

The movable portion 86 is disposed between the fixed portion 81 and the fixed portion 82. In the example shown in FIG. 1, the planar shape of the movable portion 86 is a rectangle having long sides along the X-axis.

The coupling portions 84 and 85 couple the movable portion 86 to the fixed portions 81 and 82. The coupling portions 84 and 85 each have a desired spring constant and are configured to be able to displace the movable portion 86 in the X-axis direction. In the example shown in FIG. 1, the coupling portion 84 is configured of two beams 84a and 84b each having a shape extending in the X-axis direction while meandering in a Y-axis direction. Similarly, the coupling portion 85 is configured of two beams 85a and 85b each having a shape extending in the X-axis direction while meandering in the Y-axis direction.

The movable electrode portions 87 are connected to the movable portion 86. The plurality of movable electrode portions 87 are disposed. The movable electrode portions 87 protrude from the movable portion 86 in a +Y direction and a −Y direction and are arranged in parallel in the X-axis direction so as to form a comb-teeth shape.

One end portion of each of the fixed electrode portions 88 and 89 is bonded as a fixed end to the upper surface 11 of the base substance 10, while the other end portion extends as a free end to the side of the movable portion 86. The plurality of fixed electrode portions 88 and the plurality of fixed electrode portions 89 are disposed. The fixed electrode portions 88 are electrically connected with the wiring 22, while the fixed electrode portions 89 are electrically connected with the wiring 24. The fixed electrode portions 88 and 89 are alternately arranged in parallel in the X-axis direction so as to form a comb-teeth shape. The fixed electrode portions 88 and 89 are disposed to face the movable electrode portions 87 with spacings relative to the movable electrode portions. The fixed electrode portion 88 is arranged on one side (the side of the −X direction) of the movable electrode portion 87, while the fixed electrode portion 89 is arranged on the other side (the side of the +X direction).

The fixed portions 81 and 82, the coupling portions 84 and 85, the movable portion 86, and the movable electrode portions 87 are integrally formed. The material of the functional element 80 is, for example, silicon doped with an impurity such as phosphorus or boron to provide conductivity.

A method for bonding the functional element 80 (the fixed portions 81 and 82 and the fixed electrode portions 88 and 89) and the base substance 10 together is not particularly limited. However, when, for example, the material of the base substance 10 is glass and the material of the functional element 80 is silicon, the base substance 10 and the functional element 80 can be anodically bonded together.

In the electronic device 100, an electrostatic capacitance between the movable electrode portion 87 and the fixed electrode portion 88 can be measured using the connection terminals 30 and 32. Further, in the electronic device 100, an electrostatic capacitance between the movable electrode portion 87 and the fixed electrode portion 89 can be measured using the connection terminals 30 and 34. In the electronic device 100 as described above, the electrostatic capacitance between the movable electrode portion 87 and the fixed electrode portion 88 and the electrostatic capacitance between the movable electrode portion 87 and the fixed electrode portion 89 can be separately measured to detect, based on the measured results of the electrostatic capacitances, a physical quantity (acceleration) with high accuracy.

In the above, a case has been described in which the functional element 80 is an acceleration sensor element which detects acceleration in the X-axis direction. However, the functional element 80 may be an acceleration sensor element which detects acceleration in the Y-axis direction, or an acceleration sensor element which detects acceleration in the vertical direction (the Z-axis direction). Moreover, in the electronic device 100, a plurality of such functional elements 80 may be mounted. Moreover, the functional element 80 is not limited to an acceleration sensor element but may be, for example, a gyro sensor element which detects angular velocity, or a pressure sensor element.

The electronic device 100 has, for example, the following features.

In the electronic device 100, since the contact portion 60 electrically connects the lid 50 with the connection terminal (reference potential terminal) 36, the potential of the lid 50 can be fixed. With this configuration, characteristics of the functional element can be prevented from becoming unstable due to the fluctuation of the potential of the lid, so that stabilized characteristics can be provided.

According to the electronic device 100, the contact portion 60 is disposed on the lower surface 52 of the lid 50 bonded to the upper surface 11 of the base substance 10. Therefore, in a step of bonding the upper surface 11 of the base substance 10 and the lower surface 52 of the lid 50 together, the contact portion 60 can be electrically connected to the connection terminal (reference potential terminal) 36. Accordingly, the simplification of manufacturing steps can be achieved. Further, compared to, for example, the case in which a lid and a connection terminal (reference potential terminal) disposed on a base substance are electrically connected by bonding wires or the like, reductions in the size and height of the device can be achieved.

According to the electronic device 100, the contact portion 60 and the connection terminal 36 are electrically connected through the wiring 26 disposed within the first recess 14a. With this configuration, the contact portion 60 and the connection terminal 36 can be formed at any positions, so that the degree of freedom of design can be enhanced.

According to the electronic device 100, the material of the base substance 10 is glass; the material of the lid 50 is silicon; and the upper surface 11 of the base substance 10 and the lower surface 52 of the lid 50 are anodically bonded together. With this configuration, the lid 50 can be strongly bonded to the base substance 10, so that the impact resistance of the electronic device 100 can be improved. Further, when, for example, the base substance and the lid are bonded together with an adhesive member such as glass frit, a region is required to some extent as a bonding margin because the adhesive member spreads in bonding. However, such a region can be reduced according to anodic bonding. Therefore, a reduction in the size of the electronic device 100 can be achieved.

In the electronic device 100, the functional element 80 is an electrostatic capacitive physical quantity sensor. In the electrostatic capacitive physical quantity sensor, a physical quantity such as acceleration is detected based on an electrostatic capacitance between a fixed electrode portion and a movable electrode portion. Therefore, when the potential of the lid 50 fluctuates, detection sensitivity, detection accuracy, or the like is deteriorated. In the electronic device 100, since the potential of the lid 50 can be fixed, such a problem does not occur.

According to the electronic device 100, the first through-hole 57 is disposed, in plan view, at the position of the lid 50 overlapping the groove portions 15, 16, 17, and 18, and the filling member 70 filling the groove portions 15, 16, 17, and 18 is disposed within the first through-hole 57 and within the groove portions 15, 16, 17, and 18. Therefore, the cavity 56 can be hermetically sealed by the filling member 70, so that the cavity 56 with high airtightness can be easily formed. As a result, the functional element 80 can have, for example, high detection sensitivity.

Further, in the electronic device 100, water resistance can be improved by hermetically sealing the cavity 56 with the filling member 70. For example, when the groove portion is filled with an adhesive member such as a resin, the airtightness or water resistance of the cavity is sometimes lowered.

According to the electronic device 100, the first through-hole 57 has a tapered shape in which the opening size of the first through-hole decreases toward the side of the base substance 10. Therefore, the filling member 70 can be easily formed on the inner surface of the first through-hole 57.

According to the electronic device 100, the filling member 70 is an insulating film. With this configuration, it is possible to prevent the wirings 20, 22, 24, and 26 from short-circuiting with each other.

According to the electronic device 100, the second through-hole 58 in communication with the cavity 56 is disposed in the lid 50, and the sealing member 72 closing the second through-hole 58 is disposed within the second through-hole 58. Therefore, an inert gas (for example, nitrogen gas) atmosphere can be established in the cavity 56 through the second through-hole 58. Moreover, the degree of vacuum of the cavity 56 can be controlled through the second through-hole 58.

2. Method For Manufacturing Electronic Device

Next, a method for manufacturing the electronic device according to the embodiment will be described with reference to the drawings. FIGS. 4 to 8 are cross-sectional views schematically showing manufacturing steps of the electronic device 100 according to the embodiment.

Figure 4:
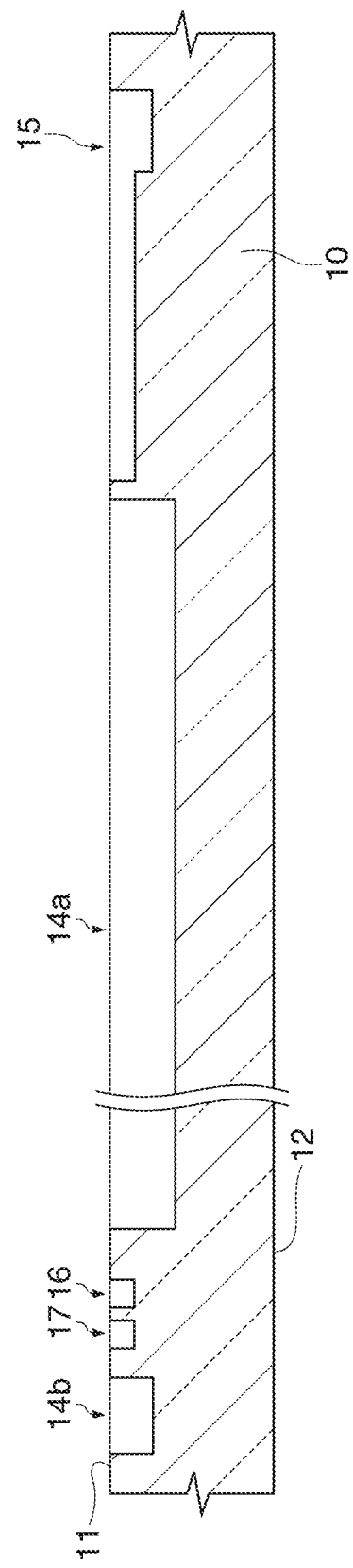
FIG. 4 is a cross-sectional view schematically showing a manufacturing step of the electronic device according to the embodiment.

As shown in FIG. 4, the recesses 14a and 14b and the groove portions 15, 16, and 17 are formed in the upper surface 11 of the base substance 10. Similarly, the groove portion 18 is formed (refer to FIG. 1). The recesses 14a and 14b and the groove portions 15, 16, 17, and 18 are formed by, for example, a photolithographic technique and an etching technique.

Figure 5:
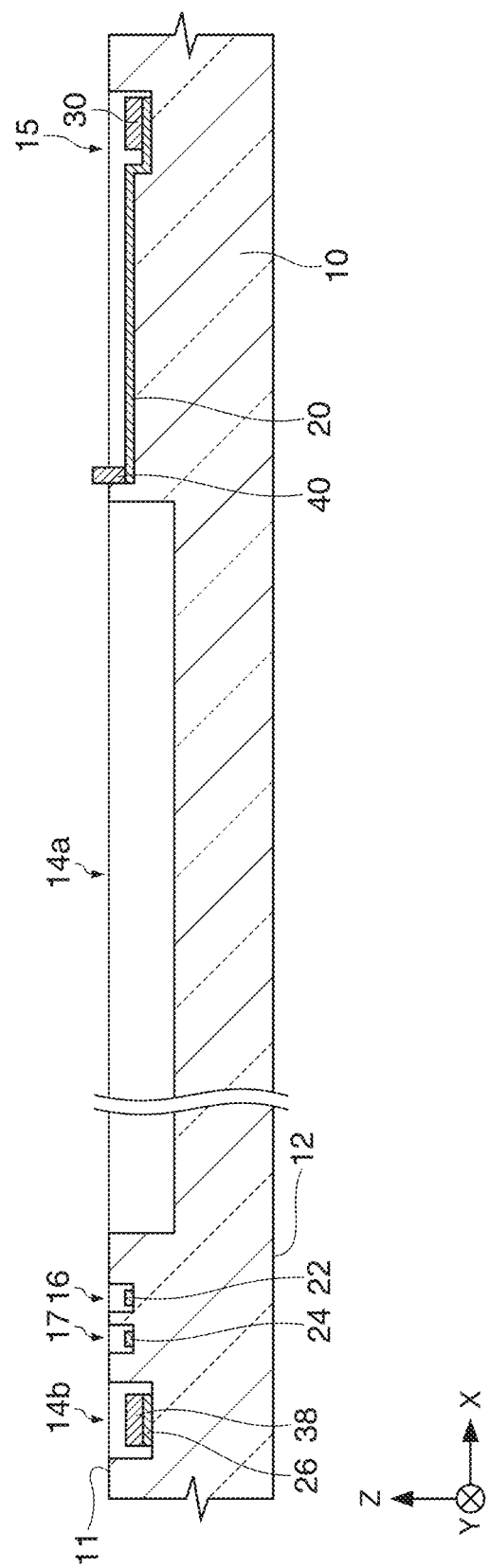
FIG. 5 is a cross-sectional view schematically showing a manufacturing step of the electronic device according to the embodiment.

As shown in FIG. 5, the wirings 20, 22, 24, and 26 are formed within the groove portions 15, 16, and 17, and within the groove portion 18 and the second recess 14b, respectively. Next, the connection terminal 30 and the contact portion 40 are formed on the wiring 20 so as to be electrically connected with the wiring 20. Similarly, the connection terminal 32 and the contact portions 42 are formed on the wiring 22 so as to be electrically connected with the wiring 22 (refer to FIG. 1). Moreover, the connection terminal 34 and the contact portions 44 are formed on the wiring 24 so as to be electrically connected with the wiring 24 (refer to FIG. 1). Similarly, the connection terminal 36 and the connection terminal 38 are formed on the wiring 26 so as to be electrically connected with the wiring 26 (refer to FIG. 1).

The wirings 20, 22, 24, and 26 are formed by, for example, depositing a conductive layer (not shown) by a sputtering method, a CVD (Chemical Vapor Deposition) method, or the like and then patterning the conductive layer. The patterning is performed by a photolithographic technique and an etching technique. The connection terminals 30, 32, 34, 36, and 38 and the contact portions 40, 42, and 44 are formed by, for example, the same method as that of the wirings 20, 22, 24, and 26. Moreover, it is preferable that the contact portions 40, 42, and 44 protrude on the upper surface (the +Z direction) by a desired value beyond the groove portions 15, 16, and 17. According to this structure, since the contact portions 40, 42, and 44 are crushed in the bonding of a silicon substrate described later with the base substance 10, electrical connection with the silicon substrate can be performed more reliably.

Through the steps described above, the base substance 10 where the wirings 20, 22, 24, and 26, the connection terminals 30, 32, 34, 36, and 38, and the contact portions 40, 42, and 44 are disposed can be prepared.

Figure 6:
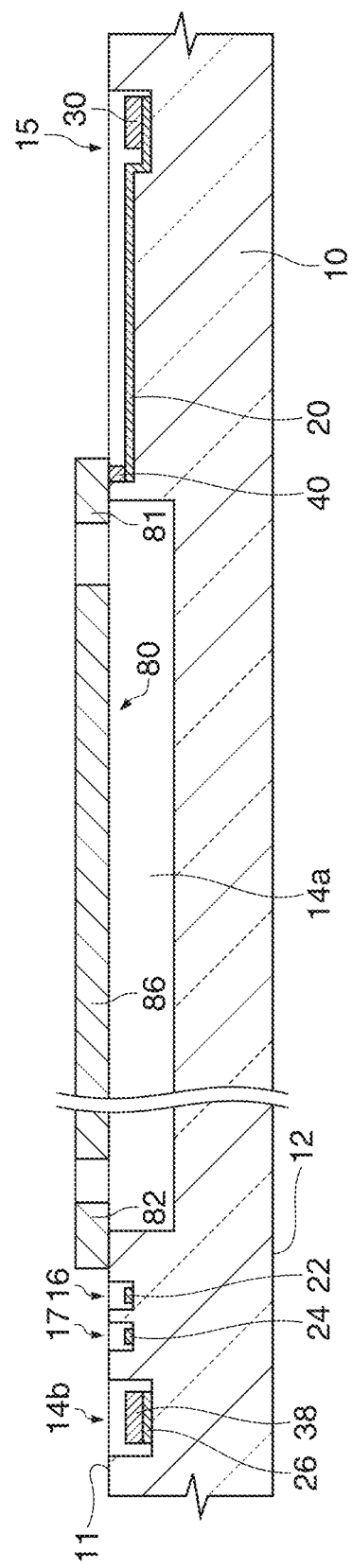
FIG. 6 is a cross-sectional view schematically showing a manufacturing step of the electronic device according to the embodiment.

As shown in FIG. 6, the functional element 80 is formed on the upper surface 11 of the base substance 10 so as to be electrically connected with the wirings 20, 22, and 24. More specifically, the functional element 80 is formed by placing (bonding) the silicon substrate (not shown) on the upper surface 11 of the base substance 10 so as to overlap the first recess 14a in plan view, thinning the silicon substrate, and then patterning the silicon substrate. The patterning is performed by a photolithographic technique and an etching technique. The bonding of the silicon substrate and the base substance 10 together can be performed by anodic bonding.

Figure 7:
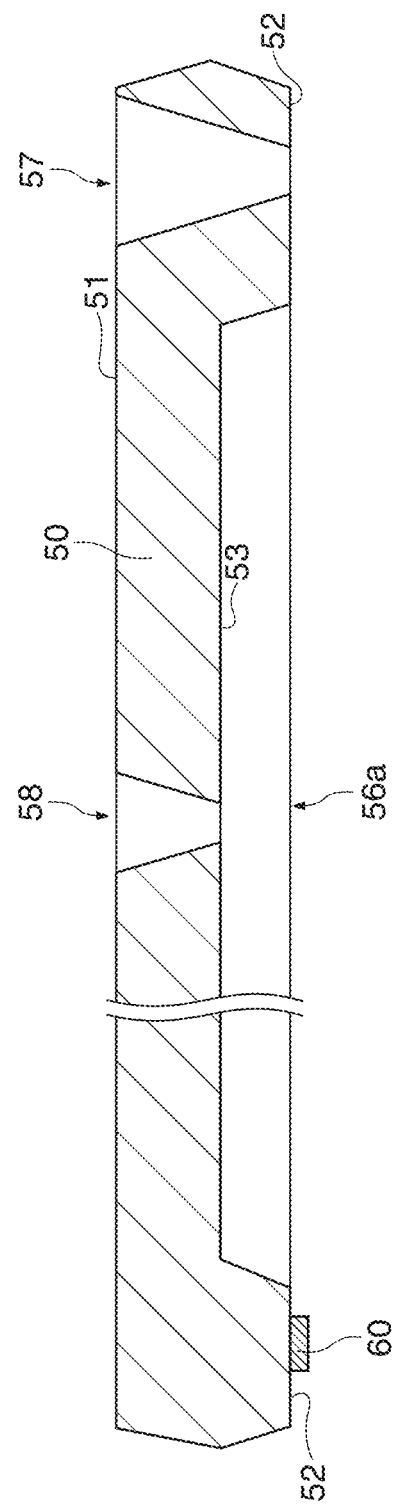
FIG. 7 is a cross-sectional view schematically showing a manufacturing step of the electronic device according to the embodiment.

As shown in FIG. 7, an indentation 56a serving as the cavity 56 is formed in the lower surface 52 of the lid 50. Next, the first through-hole 57 penetrating from the upper surface 51 to the lower surface 52 of the lid 50 and the second through-hole 58 penetrating from the upper surface 51 of the lid 50 to the surface 53 defining the cavity 56 are formed.

The indentation 56a and the through-holes 57 and 58 are formed by a photolithographic technique and an etching technique. More specifically, the indentation 56a is formed by wet etching from the side of the lower surface 52. The through-holes 57 and 58 are formed by wet etching from the side of the upper surface 51. By forming the through-holes 57 and 58 by wet etching, the through-holes 57 and 58 each can be made into a tapered shape. When the lid 50 where the through-holes 57 and 58 are disposed is formed by processing a (100) silicon substrate by wet etching, the inner surface of each of the through-holes 57 and 58 is a (111) surface or a surface equivalent to the (111) surface.

The first through-hole 57 and the second through-hole 58 may be formed by the same wet etching step or by separate wet etching steps. Moreover, the order of the step of forming the indentation 56a and the step of forming the through-holes 57 and 58 is not limited.

Next, the contact portion (bump) 60 is formed on the lower surface 52 of the lid 50. The contact portion 60 is formed by, for example, depositing and patterning a photoresist, depositing a conductive material (not shown) by a plating method, a CVD method, or the like, and then removing the photoresist.

Through the steps described above, the lid 50 where the indentation 56a, the through-holes 57 and 58, and the contact portion 60 are disposed can be prepared.

The order of the step of preparing the base substance 10 where the wirings 20, 22, 24, and 26, the connection terminals 30, 32, 34, 36, and 38, and the contact portions 40, 42, and 44 are disposed and the step of preparing the lid 50 where the indentation 56a, the through-holes 57 and 58, and the contact portion 60 are disposed is not limited.

Moreover, the order of the step of forming the functional element 80 on the upper surface 11 of the base substance 10 and the step of preparing the lid 50 where the indentation 56a, the through-holes 57 and 58, and the contact portion 60 are disposed is not limited.

Figure 8:
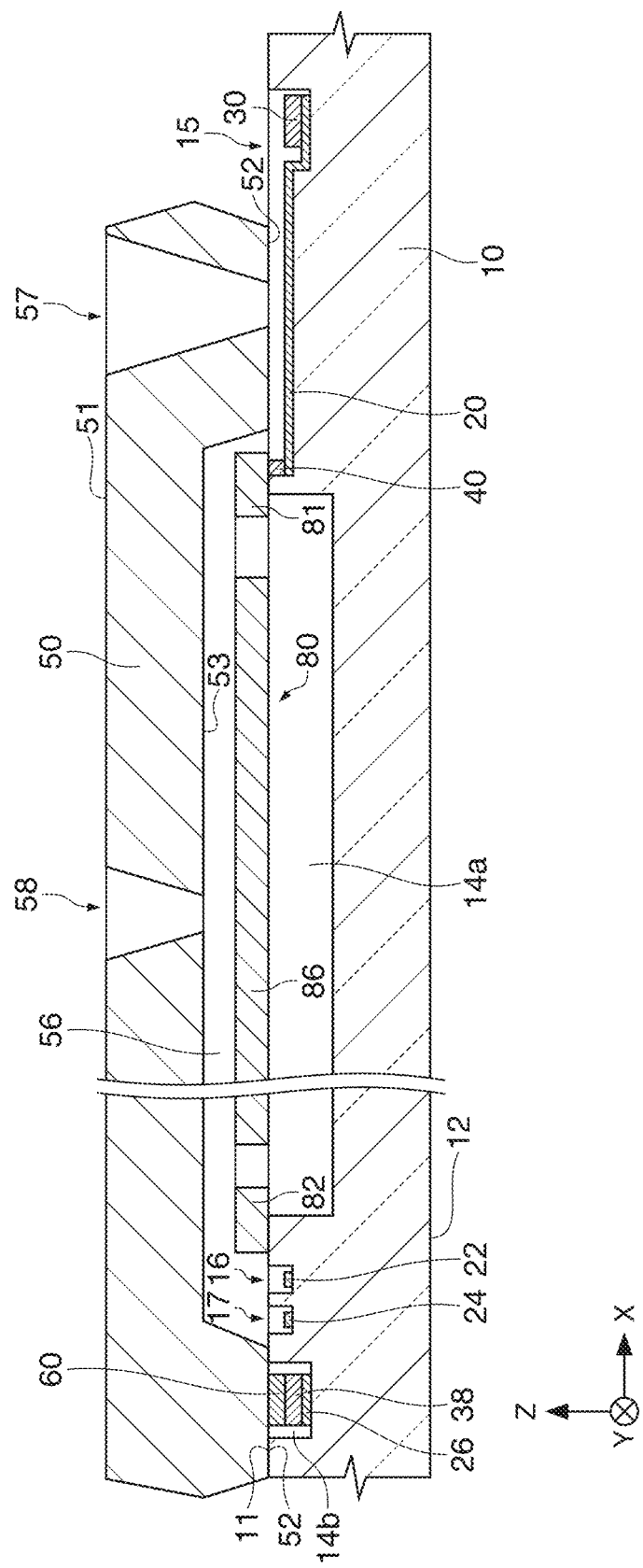
FIG. 8 is a cross-sectional view schematically showing a manufacturing step of the electronic device according to the embodiment.

As shown in FIG. 8, the lower surface 52 of the lid 50 is bonded to the upper surface 11 of the base substance 10, so that the functional element 80 is accommodated in the cavity 56 surrounded by the base substance 10 and the lid 50, and that the contact portion 60 is arranged within the second recess 14b to connect the contact portion 60 with the connection terminal 38. The upper surface 11 of the base substance 10 and the lower surface 52 of the lid 50 are bonded together, whereby the contact portion 60 is pressure-bonded to the connection terminal 38. With this configuration, the contact portion 60 is electrically connected to the wiring 26 via the connection terminal 38. Accordingly, the lid 50 and the connection terminal (reference potential terminal) 36 can be electrically connected through the step. The bonding of the upper surface 11 of the base substance 10 and the lower surface 52 of the lid 50 together can be performed by anodic bonding.

For example, in the step of forming the contact portion 60 described above, the contact portion 60 is formed to have a thickness greater than a distance (the distance in the Z-axis direction) between an upper surface of the connection terminal 38 and the upper surface 11 of the base substance 10, whereby the contact portion 60 is crushed in the bonding of the lower surface 52 of the lid 50 to the upper surface 11 of the base substance 10, making it possible to pressure-bond the contact portion 60 and the connection terminal 38 together. With this configuration, the contact portion 60 and the connection terminal 38 can be reliably connected. Moreover, the use of gold as the material of the contact portion 60 and the connection terminal 38 can cause eutectic reaction with heat generated in anodic bonding. Herein, a case has been described in which the contact portion 60 is disposed on the lower surface 52 of the lid 50. However, the contact portion 60 may be disposed on the wiring 26. Also in such a case similarly, the lid 50 and the contact portion 60 are bonded together in the step of bonding the lid 50 to the base substance 10, so that the lid 50 and the connection terminal (reference potential terminal) 36 can be electrically connected.

As shown in FIGS. 2 and 3, the filling member 70 is formed within the first through-hole 57 and within the groove portion 15 so as to fill the groove portion 15. The filling member 70 is also formed within the groove portions 16, 17, and 18, so that the groove portions 16, 17, and 18 can be filled. The filling member 70 is formed by depositing an insulating film (not shown) by a CVD method or the like.

Next, the atmosphere of the cavity 56 is controlled with the second through-hole 58. For example, an inert gas (nitrogen gas) atmosphere may be established in the cavity 56 through the second through-hole 58, or a reduced-pressure state may be established.

By forming the filling member 70 in a reduced-pressure state like a CVD method or the like, the step of establishing a reduced-pressure state in the cavity 56 through the second through-hole 58 can be omitted. That is, the second through-hole 58 may not be disposed. With this configuration, the simplification of the steps can be achieved. For example, when the functional element 80 is a gyro sensor element, it is desirable that a reduced-pressure state is established in the cavity 56. With this configuration, the attenuation of a vibration phenomenon of a gyro sensor element due to the viscosity of air can be suppressed.

Next, the sealing member 72 is formed within the second through-hole 58 to close the second through-hole 58. More specifically, the sealing member 72 is formed by arranging a spherical solder ball (not shown) within the second through-hole 58 and melting the solder ball by laser irradiation. The cavity 56 can be hermetically sealed by the filling member 70 and the sealing member 72.

Through the steps described above, the electronic device 100 can be manufactured.

The method for manufacturing the electronic device 100 has, for example, the following features.

According to the method for manufacturing the electronic device 100, the upper surface 11 of the base substance 10 and the lower surface 52 of the lid 50 are bonded together, so that the functional element 80 is accommodated in the cavity 56 surrounded by the base substance 10 and the lid 50, and that the contact portion 60 can be arranged within the second recess 14b to electrically connect the lid 50 with the connection terminal (reference potential terminal) 36. That is, the step of accommodating the functional element 80 in the cavity 56 and the step of electrically connecting the contact portion 60 with the connection terminal 38 can be performed in the same step. Accordingly, the manufacturing steps can be simplified.

According to the method for manufacturing the electronic device 100, in the step of bonding the lower surface 52 of the lid 50 to the upper surface 11 of the base substance 10, the contact portion 60 is arranged within the second recess 14b, and therefore the positioning between the lid 50 and the base substance 10 is easily performed. Further, the lid 50 can be prevented from shifting in the bonding of the lid 50 to the base substance 10.

According to the method for manufacturing the electronic device 100, the first through-hole 57 is formed at the position of the lid 50, the position overlapping the groove portions 15, 16, 17, and 18 in plan view, and the filling member 70 filling the groove portions 15, 16, 17, and 18 can be formed within the first through-hole 57 and within the groove portions 15, 16, 17, and 18. Therefore, the cavity 56 can be hermetically sealed, so that the electronic device 100 including the cavity 56 with high airtightness can be easily formed by, for example, a processing technique used in the manufacture of a semiconductor device.

Further, in the method for manufacturing the electronic device 100, the material of the base substance 10 is glass; the material of the lid 50 is silicon; and the bonding of the base substance 10 (the upper surface 11) and the lid (the lower surface 52) together is performed by anodic bonding. With this configuration, the lid 50 can be strongly bonded to the base substance 10, so that an improvement in the impact resistance of the electronic device 100 can be achieved. Further, when, for example, the base substance and the lid are bonded together with an adhesive member such as glass frit, a region is required to some extent as a bonding margin because the adhesive member spreads in bonding. However, such a region can be reduced according to anodic bonding. Therefore, a reduction in the size of the electronic device 100 can be achieved.

According to the method for manufacturing the electronic device 100, the first through-hole 57 is formed by wet etching. Therefore, the first through-hole 57 can be made into a tapered shape in which the opening size of the first through-hole decreases toward the side of the base substance 10. With this configuration, the filling member 70 can be easily formed on the inner surface of the first through-hole 57.

3. Modified Examples of Electronic Device

Next, electronic devices according to modified examples of the embodiment will be described with reference to the drawings.

Figure 9:
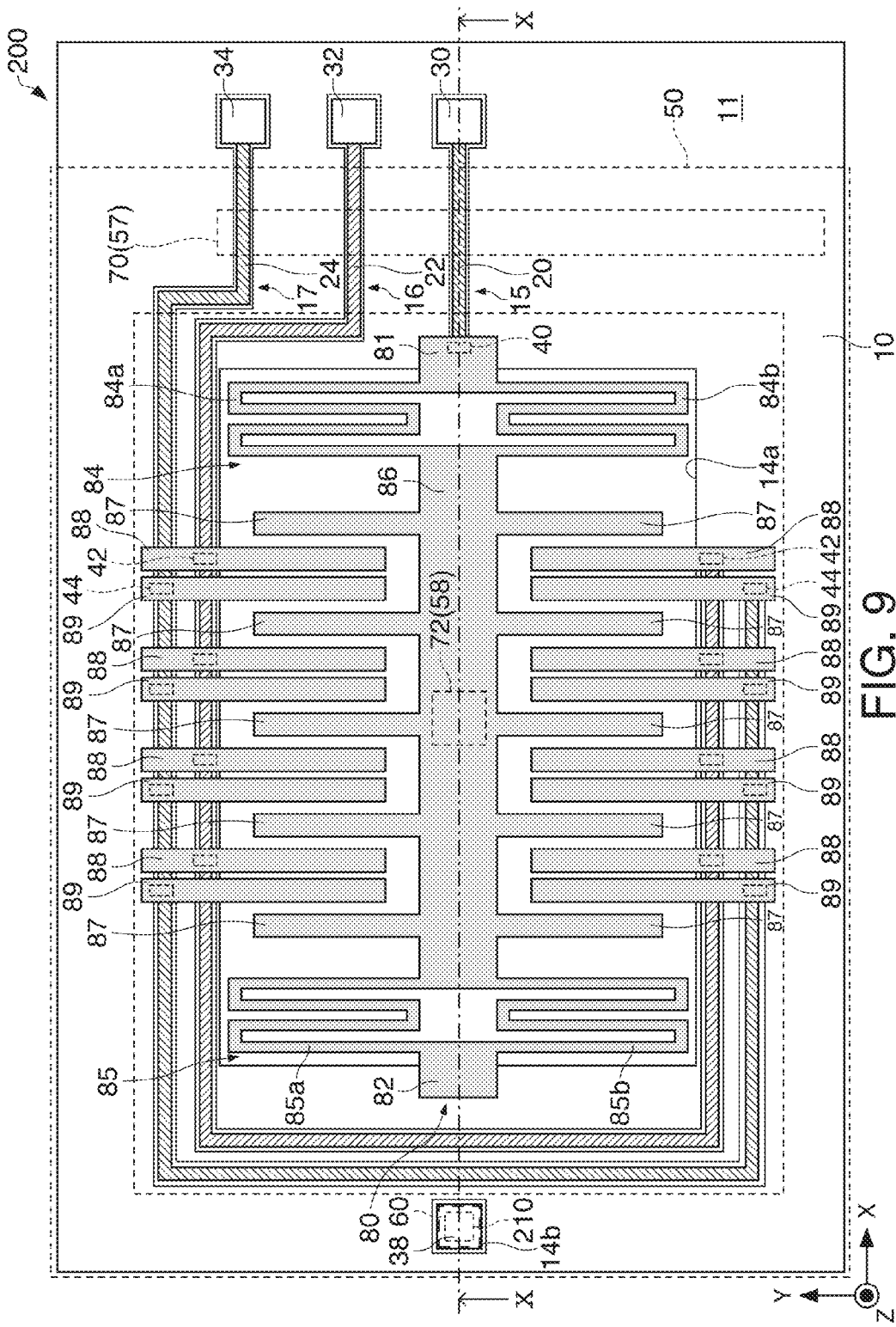
FIG. 9 is a plan view schematically showing an electronic device according to a first modified example of the embodiment.
Figure 10:
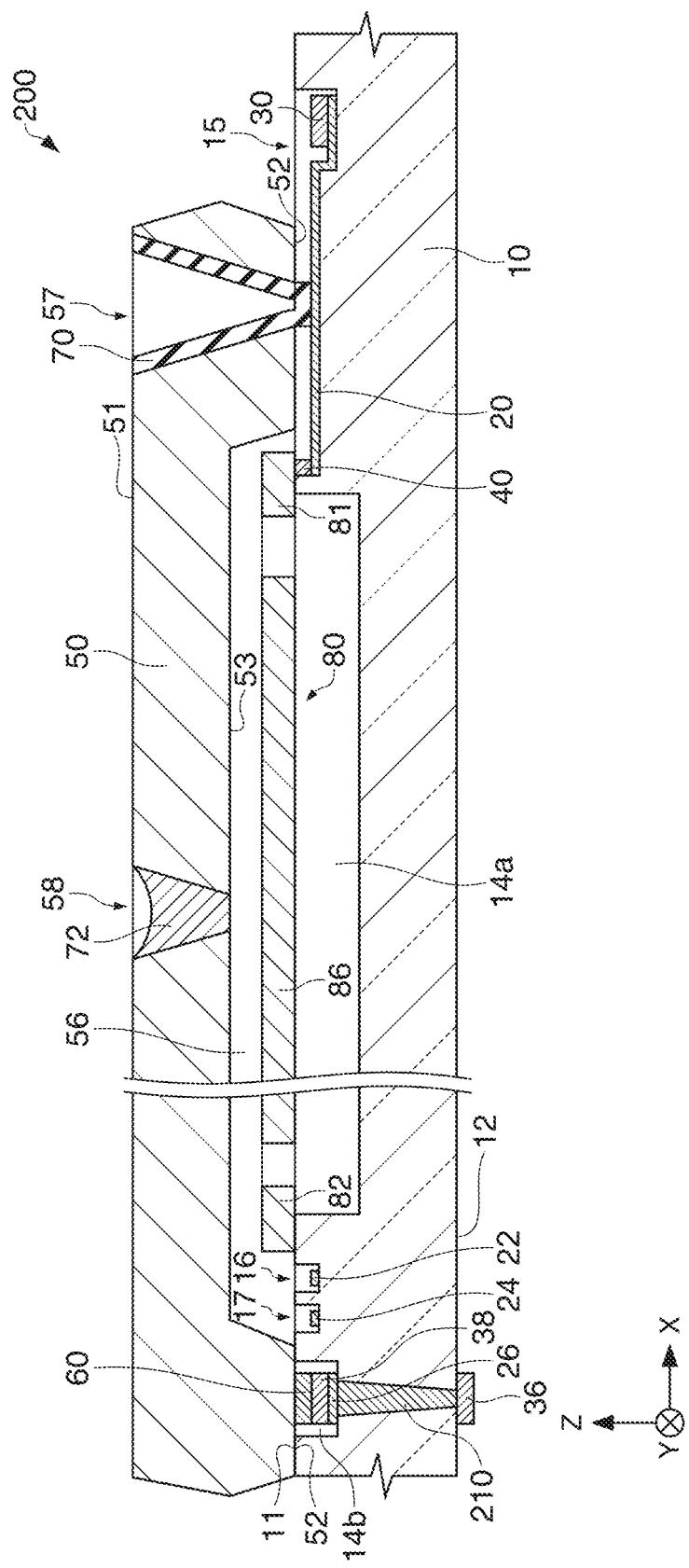
FIG. 10 is a cross-sectional view schematically showing the electronic device according to the first modified example of the embodiment.

(1) First, an electronic device according to a first modified example of the embodiment will be described with reference to the drawings. FIG. 9 is a plan view schematically showing the electronic device 200 according to the first modified example of the embodiment. FIG. 10 is a cross-sectional view schematically showing the electronic device 200 according to the first modified example of the embodiment and taken along line X-X of FIG. 9. For convenience sake, the lid 50, the filling member 70, and the sealing member 72 are illustrated in a perspective manner in FIG. 9.

Hereinafter, in the electronic device 200 according to the first modified example of the embodiment, members having functions similar to those of the constituent members of the electronic device 100 according to the embodiment are denoted by the same reference numerals and signs, and therefore the detailed descriptions thereof are omitted.

In the electronic device 200 as shown in FIGS. 9 and 10, the connection terminal (reference potential terminal) 36 is disposed on the lower surface 12 of the base substance 10. Moreover, the contact portion 60 and the connection terminal 36 are electrically connected via a through-electrode 210.

In the example shown in FIG. 10, the contact portion 60 and the connection terminal 36 are electrically connected via the connection terminal 38, the wiring 26, and the through-electrode 210.

The through-electrode 210 penetrates through the base substance 10. In the example of FIG. 10, the through-electrode 210 is disposed from a surface of the base substance 10, the surface defining the bottom surface of the second recess 14b, to the lower surface 12 of the base substance 10, penetrating through the base substance 10 in the Z-axis direction. The through-electrode 210 has, for example, a tapered shape in which the cross-sectional area (the area in a XY plane) of the through-electrode decreases toward the side of the lower surface 12 of the base substance 10.

The through-electrode 210 can be formed by, for example, forming a through-hole penetrating through the base substance 10 in the Z-axis direction by etching or the like and filling a conductive material in the through-hole.

According to the electronic device 200, the contact portion 60 and the connection terminal 36 can be electrically connected via the through-electrode 210. Therefore, for example, the wiring length of the wiring 26 (a wiring which electrically connects the lid 50 with the connection terminal (reference potential terminal) 36) disposed on the upper surface 11 of the base substance 10 can be shortened.

Moreover, according to the electronic device 200, operational effects similar to those of the electronic device 100 described above can be provided.

A method for manufacturing the electronic device 200 is similar to that of the electronic device 100 described above excepting the step of forming the through-electrode 210, and therefore the description thereof is omitted.

Figure 11:
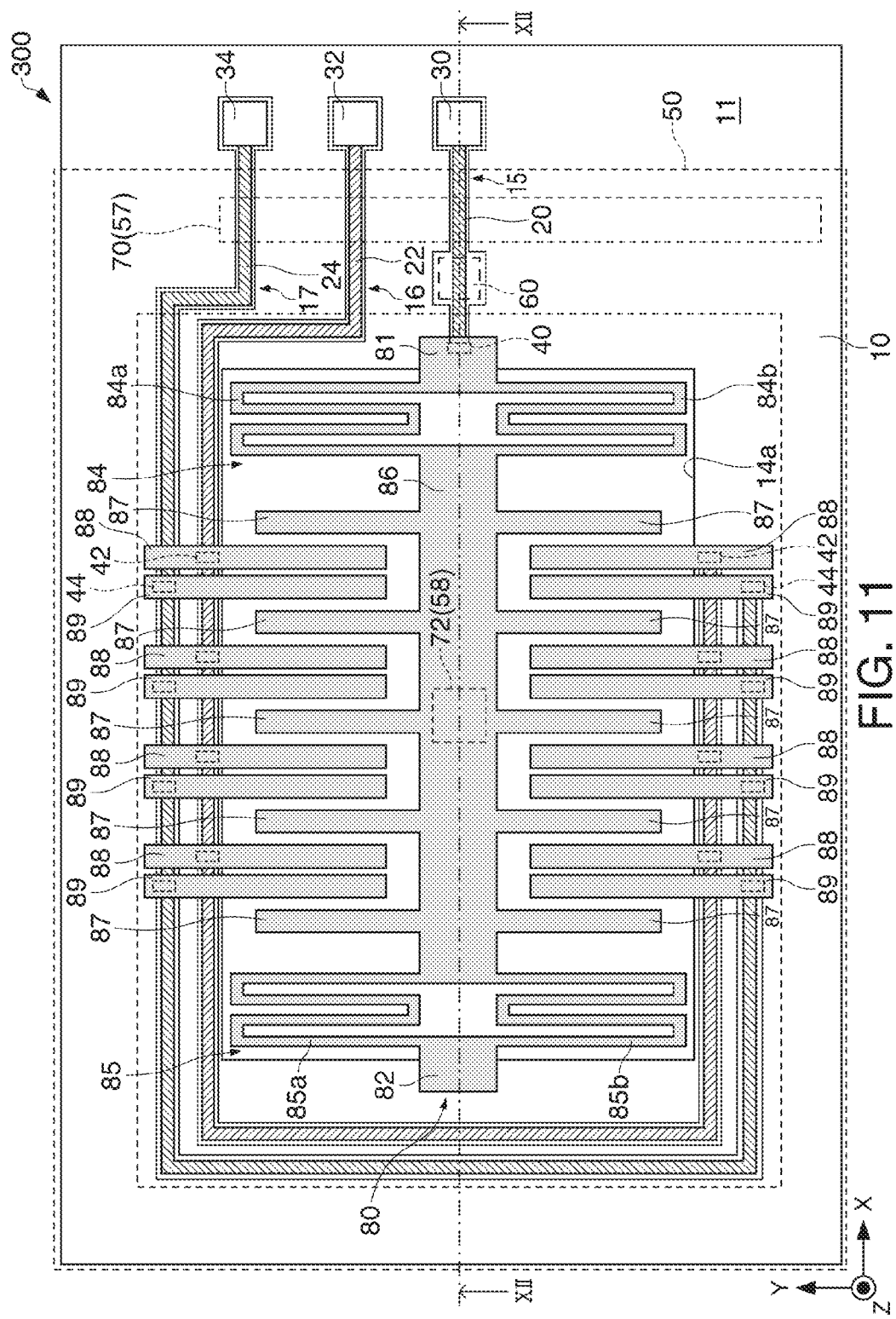
FIG. 11 is a plan view schematically showing an electronic device according to a second modified example of the embodiment.
Figure 12:
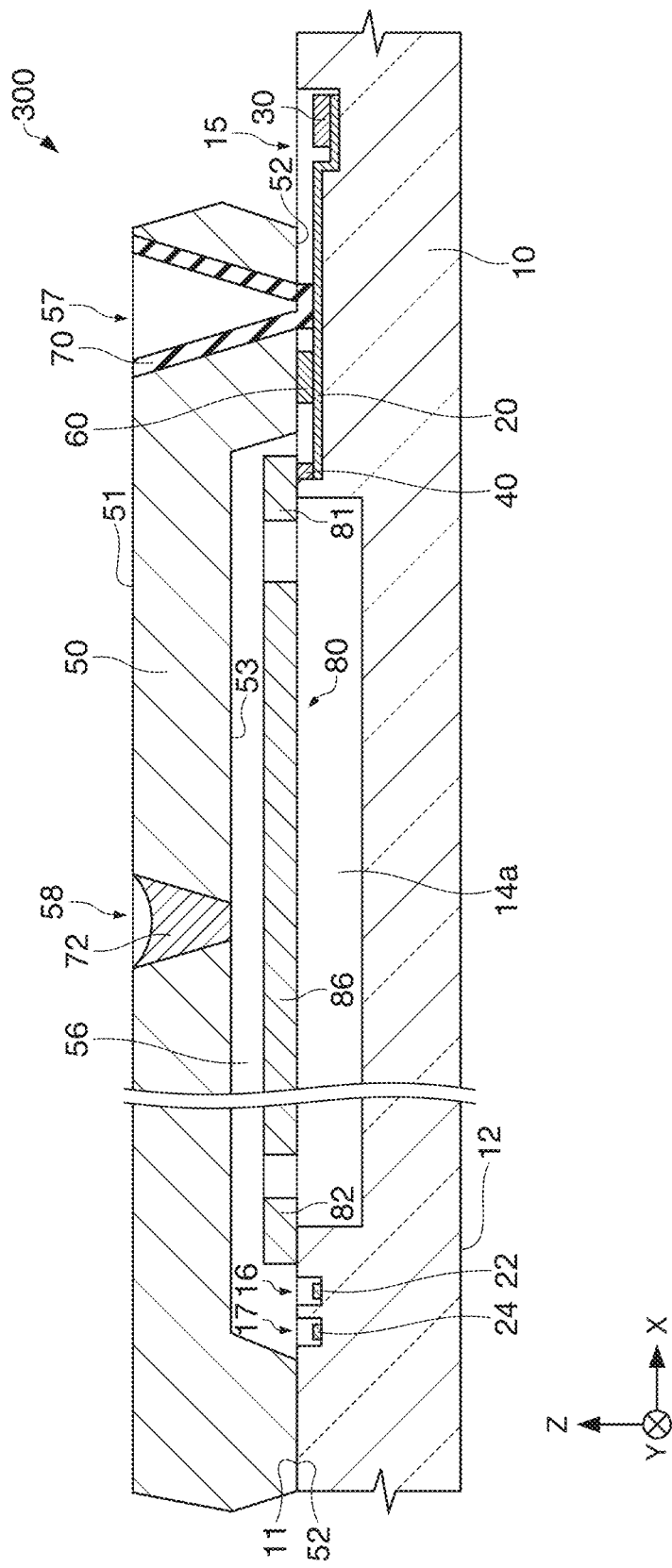
FIG. 12 is a cross-sectional view schematically showing the electronic device according to the second modified example of the embodiment.

(2) Next, an electronic device according to a second modified example of the embodiment will be described with reference to the drawings. FIG. 11 is a plan view schematically showing the electronic device 300 according to the second modified example of the embodiment. FIG. 12 is a cross-sectional view schematically showing the electronic device 300 according to the second modified example of the embodiment and taken along line XII-XII of FIG. 11. For convenience sake, the lid 50, the filling member 70, and the sealing member 72 are illustrated in a perspective manner in FIG. 11.

Hereinafter, in the electronic device 300 according to the second modified example of the embodiment, members having functions similar to those of the constituent members of the electronic device 100 according to the embodiment are denoted by the same reference numerals and signs, and therefore the detailed descriptions thereof are omitted.

In the electronic device 300 as shown in FIGS. 11 and 12, the contact portion 60 is arranged, in plan view (viewed from the Z-axis direction), between the functional element 80 and the connection terminal (reference potential terminal) 30 and electrically connected to the wiring 20.

In the electronic device 300, a potential serving as a reference (a potential not fluctuating in the operation of the functional element; a fixed potential) is given to the connection terminal 30 from the outside. The wiring 20 electrically connects the functional element 80 with the connection terminal 30. The contact portion 60 is arranged within the groove portion 15 (recess) in which the wiring 20 is disposed, and electrically connected to the wiring 20. In the illustrated example, the contact portion 60 is directly connected to the wiring 20. However, the contact portion 60 may be electrically connected to the wiring 20 via a connection terminal (not shown).

In the electronic device 300 as described above, the wiring 20 which electrically connects the functional element 80 with the connection terminal (reference potential terminal) 30 is provided, and the contact portion 60 is arranged, in plan view, between the functional element 80 and the connection terminal 30. Therefore, it is unnecessary, for example, to dispose a wiring for connecting the contact portion with the connection terminal (reference potential terminal). Further, compared to, for example, the case in which the contact portion is not arranged between the functional element and the connection terminal (reference potential terminal), the wiring length (the length of the wiring 20) can be shortened, so that the wiring capacitance can be reduced.

Moreover, according to the electronic device 300, operational effects similar to those of the electronic device 100 described above can be provided.

A method for manufacturing the electronic device 300 is similar to that of the electronic device 100 described above excepting that the contact portion 60 is arranged, in plan view, between the functional element 80 and the connection terminal 30 and electrically connected to the wiring 20, and therefore the description thereof is omitted.

Figure 13:
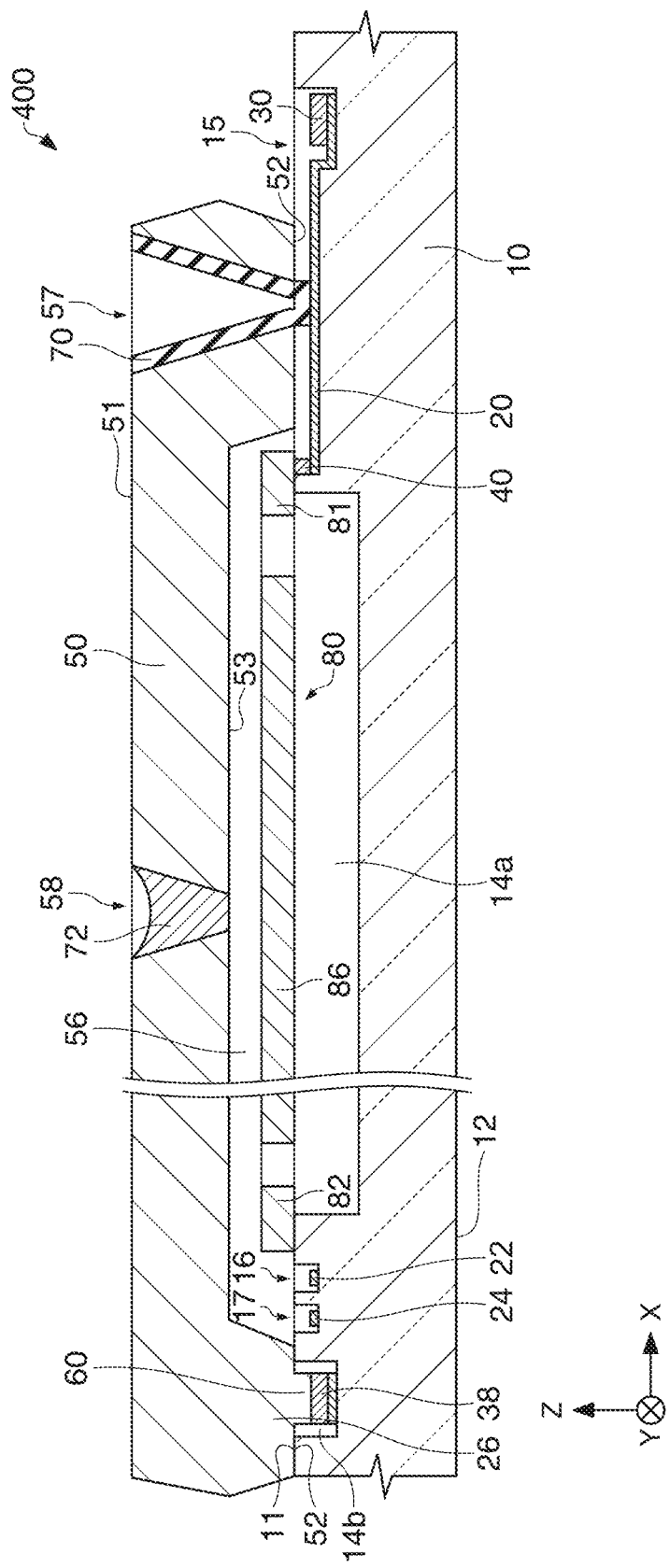
FIG. 13 is a cross-sectional view schematically showing an electronic device according to a third modified example of the embodiment.

(3) Next, an electronic device according to a third modified example of the embodiment will be described with reference to the drawing. FIG. 13 is a cross-sectional view schematically showing the electronic device 400 according to the third modified example of the embodiment.

Hereinafter, in the electronic device 400 according to the third modified example of the embodiment, members having functions similar to those of the constituent members of the electronic device 100 according to the embodiment are denoted by the same reference numerals and signs, and therefore the detailed descriptions thereof are omitted.

In the electronic device 400 as shown in FIG. 13, the contact portion 60 is disposed integrally with the lid 50. That is, the material of the contact portion 60 is the same as that of the lid 50. In the example shown in FIG. 13, the contact portion 60 is a protrusion disposed integrally with the lid 50 on the lower surface 52 of the lid 50. Although not illustrated, a conductive film may be disposed at a tip portion (a portion contacting the connection terminal 38) of the protrusion.

According to the electronic device 400, operational effects similar to those of the electronic device 100 described above can be provided.

4. Electronic Apparatuses

Next, electronic apparatuses according to the embodiment will be described with reference to the drawings. The electronic apparatuses according to the embodiment include any of the electronic devices according to the embodiment of the invention. In the following, electronic apparatuses including the electronic device 100 as the electronic device according to the embodiment of the invention will be described.

Figure 14:
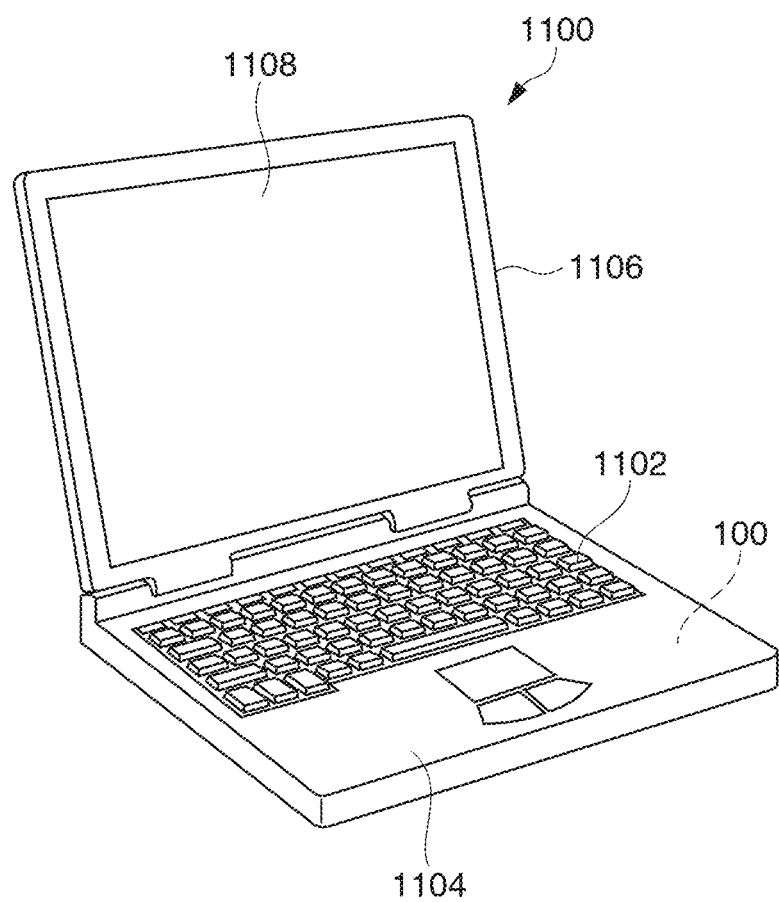
FIG. 14 is a perspective view schematically showing an electronic apparatus according to the embodiment.

FIG. 14 is a perspective view schematically showing a mobile (or notebook) personal computer 1100 as an electronic apparatus according to the embodiment.

As shown in FIG. 14, the personal computer 1100 is configured of a main body portion 1104 including a keyboard 1102 and a display unit 1106 having a display portion 1108. The display unit 1106 is rotationally movably supported relative to the main body portion 1104 via a hinge structure portion.

In the personal computer 1100, the electronic device 100 is incorporated.

Figure 15:
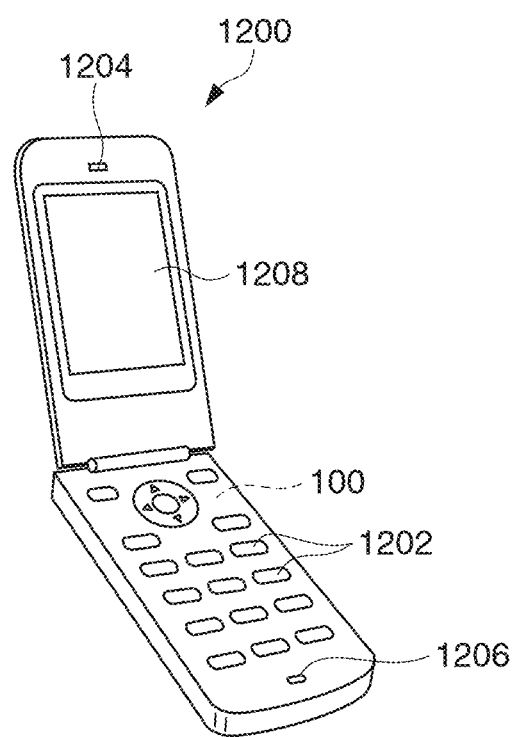
FIG. 15 is a perspective view schematically showing an electronic apparatus according to the embodiment.

FIG. 15 is a perspective view schematically showing a cellular phone (including a PHS) 1200 as an electronic apparatus according to the embodiment.

As shown in FIG. 15, the cellular phone 1200 includes a plurality of operation buttons 1202, an earpiece 1204, and a mouthpiece 1206. A display portion 1208 is arranged between the operation buttons 1202 and the earpiece 1204.

In the cellular phone 1200, the electronic device 100 is incorporated.

Figure 16:
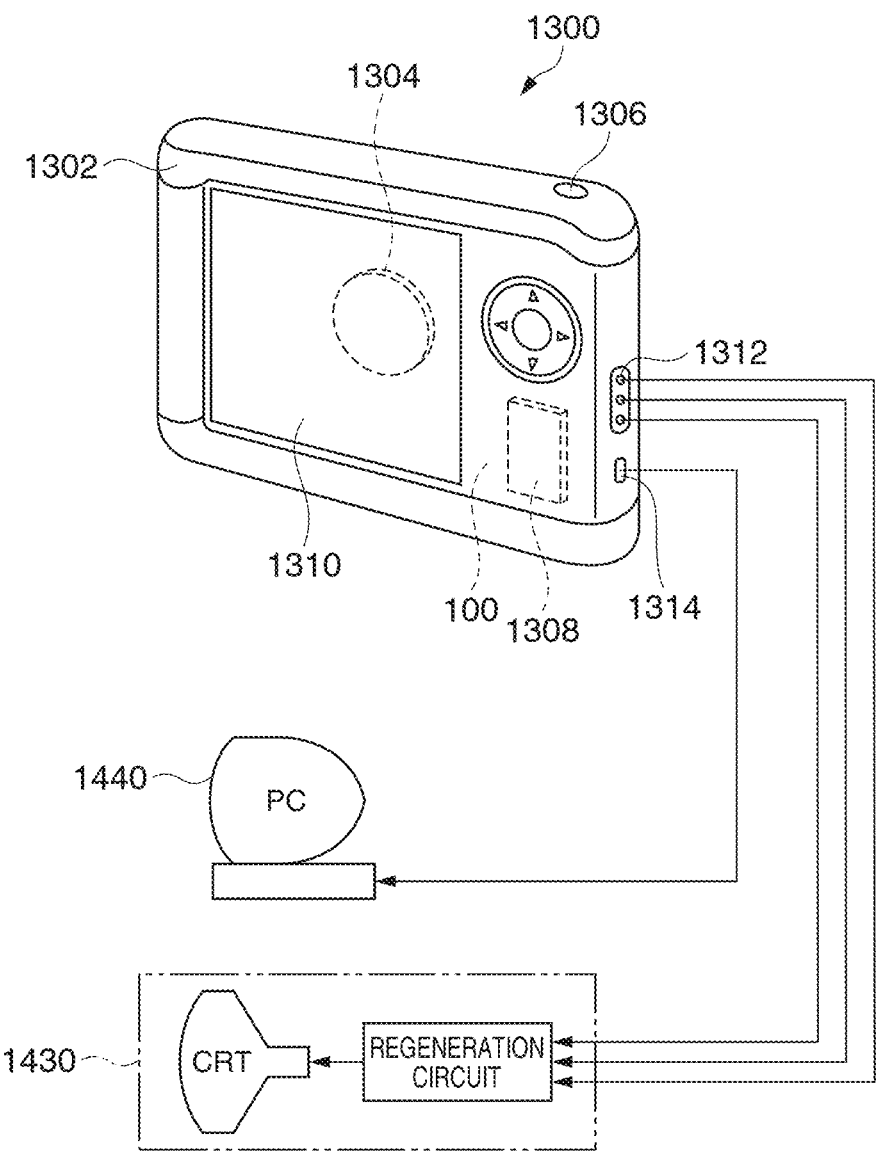
FIG. 16 is a perspective view schematically showing an electronic apparatus according to the embodiment.

FIG. 16 is a perspective view schematically showing a digital still camera 1300 as an electronic apparatus according to the embodiment. In FIG. 16, connections with external apparatuses are also shown in a simplified manner.

Here, usual cameras expose a silver halide photographic film with an optical image of a subject, whereas the digital still camera 1300 generates imaging signals (image signals) by photoelectrically converting an optical image of a subject with an imaging element such as a CCD (Charge Coupled Device).

A display portion 1310 is disposed on the back surface of a case (body) 1302 in the digital still camera 1300 and configured to perform display based on imaging signals generated by a CCD. The display portion 1310 functions as a finder which displays a subject as an electronic image.

Moreover, on the front side (the rear side in the drawing) of the case 1302, a light receiving unit 1304 including an optical lens (imaging optical system) and a CCD is disposed.

When a photographer confirms a subject image displayed on the display portion 1310 and presses down a shutter button 1306, imaging signals of a CCD at the time are transferred to and stored in a memory 1308.

Moreover, in the digital still camera 1300, a video signal output terminal 1312 and a data communication input/output terminal 1314 are disposed on the side surface of the case 1302. Then, a television monitor 1430 and a personal computer 1440 are connected as necessary to the video signal output terminal 1312 and the data communication input/output terminal 1314, respectively. Further, the digital still camera 1300 is configured such that the imaging signals stored in the memory 1308 are output to the television monitor 1430 or the personal computer 1440 by a predetermined operation.

In the digital still camera 1300, the electronic device 100 is incorporated.

The electronic apparatuses 1100, 1200, and 1300 described above include the electronic device 100 having stabilized characteristics. Therefore, the electronic apparatuses 1100, 1200, and 1300 can have stabilized characteristics.

An electronic apparatus including the electronic device 100 can be applied to for example, in addition to the personal computer (mobile personal computer) shown in FIG. 14, the cellular phone shown in FIG. 15, and the digital still camera shown in FIG. 16, inkjet ejection apparatuses (for example, inkjet printers), laptop personal computers, television sets, video camcorders, video tape recorders, various kinds of navigation systems, pagers, electronic notebooks (including those with communication function), electronic dictionaries, calculators, electronic gaming machines, word processors, workstations, videophones, surveillance television monitors, electronic binoculars, POS terminals, medical equipment (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, rockets, and ships), the attitude control of robots, the human body, or the like, and flight simulators.

The invention includes a configuration (for example, a configuration having the same function, method, and result, or a configuration having the same advantage and effect) which is substantially the same as those described in the embodiment. Moreover, the invention includes a configuration in which a non-essential portion of the configurations described in the embodiment is replaced. Moreover, the invention includes a configuration providing the same operational effects as those described in the embodiment, or a configuration capable of achieving the same advantages. Moreover, the invention includes a configuration in which a publicly known technique is added to the configurations described in the embodiment.

The entire disclosure of Japanese Patent Application No. 2012-026617, filed Feb. 9, 2012 is expressly incorporated by reference herein.

What is claimed is:

1. An electronic device comprising:
    a first member including a reference potential terminal which is disposed on a side of a first surface of the first member;
    a second member placed on the first surface of the first member and having conductivity;
    a functional element accommodated in a cavity surrounded by the first member and the second member;
    a recess disposed on the side of the first surface of the first member; and
    a wiring which connects a contact portion with the reference potential terminal, wherein
    the wiring and the contact portion are completely disposed within the recess,
    the second member and the reference potential terminal are electrically connected via the contact portion and the wiring, and
    the contact portion is disposed on the wiring in the recess so that the wiring, the contact portion, and the second member are laminated from a bottom surface of the recess toward the second member.

2. The electronic device according to claim 1, wherein the contact portion is disposed integrally with the second member.

3. The electronic device according to claim 1, wherein a material of the first member is glass, a material of the second member is silicon, and the first member and the second member are anodically bonded together.

4. The electronic device according to claim 1, wherein the functional element is a physical quantity sensor.

5. An electronic apparatus comprising the electronic device according to claim 1.

6. An electronic device comprising:
a first member including a reference potential terminal;
a second member placed on a first surface of the first member and having conductivity;
a functional element accommodated in a cavity surrounded by the first member and the second member; and
a recess disposed in the first surface of the first member, wherein
the second member and the reference potential terminal are electrically connected via a contact portion,
the reference potential terminal is disposed on a second surface, which is opposite to the first surface, of the first member, and
the contact portion and the reference potential terminal are connected via a through-electrode penetrating through the first member wherein
the contact portion is completely disposed within the recess.

7. The electronic device according to claim 6, wherein the contact portion is disposed integrally with the second member.

8. The electronic device according to claim 6, wherein
a material of the first member is glass,
a material of the second member is silicon, and
the first member and the second member are anodically bonded together.

9. The electronic device according to claim 6, wherein the functional element is a physical quantity sensor.

10. An electronic device comprising:
a first member including a reference potential terminal which is disposed on a side of a first surface of the first member;
a second member placed on the first surface of the first member and having conductivity;
a functional element accommodated in a cavity surrounded by the first member and the second member;
a recess disposed on the side of the first surface of the first member; and
a wiring which connects a contact portion with the reference potential terminal, wherein
the wiring and the contact portion are completely disposed within the recess,
the second member and the reference potential terminal are electrically connected via the contact portion and the wiring,
the contact portion is disposed on the wiring in the recess so that the wiring, the contact portion, and the second member are laminated from a bottom surface of the recess toward the second member, and
the reference potential terminal is electrically connected with the functional element through the wiring.

11. The electronic device according to claim 10, wherein the contact portion is disposed integrally with the second member.

12. The electronic device according to claim 10, wherein
a material of the first member is glass,
a material of the second member is silicon, and
the first member and the second member are anodically bonded together.

13. The electronic device according to claim 10, wherein the functional element is a physical quantity sensor.

* * * * *